(12) United States Patent
Yuan et al.

(10) Patent No.: US 11,961,466 B2
(45) Date of Patent: Apr. 16, 2024

(54) SHIFT REGISTER UNIT, DRIVING METHOD THEREOF, GATE DRIVING CIRCUIT, AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN); Pan Xu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 25 days.

(21) Appl. No.: 17/333,483

(22) Filed: May 28, 2021

(65) Prior Publication Data

US 2022/0020324 A1 Jan. 20, 2022

(30) Foreign Application Priority Data

Jul. 14, 2020 (CN) .......................... 202010673759.1

(51) Int. Cl.
*G11C 19/28* (2006.01)
*G06F 3/041* (2006.01)
*G09G 3/3225* (2016.01)
*G09G 3/3266* (2016.01)
*G09G 3/3291* (2016.01)

(Continued)

(52) U.S. Cl.
CPC ........... *G09G 3/3225* (2013.01); *G11C 19/28* (2013.01); *G09G 2310/0286* (2013.01); *G09G 2310/08* (2013.01)

(58) Field of Classification Search
CPC ......... G09G 3/3225; G09G 2310/0286; G09G 2310/08; G11C 19/28
See application file for complete search history.

(56) References Cited

U.S. PATENT DOCUMENTS

2006/0061385 A1 * 3/2006 Jinta ....................... G11C 19/00
326/81
2017/0116926 A1 * 4/2017 Bong ................... G09G 3/3266
(Continued)

FOREIGN PATENT DOCUMENTS

CN 108346405 A * 7/2018 ........... G09G 3/3674

*Primary Examiner* — Lin Li
(74) *Attorney, Agent, or Firm* — BROOKS KUSHMAN P.C.

(57) ABSTRACT

A shift register unit and a driving method thereof, a gate driving circuit, and a display device. The shift register unit includes: an input circuit, a first capacitor circuit, an output circuit, an output pull-down circuit, a coupling circuit, and an inverter circuit. The inverter circuit is coupled to an input control terminal, a first node, a second node, and a first level signal input terminal, and a second level signal input terminal; and used to control to connect or disconnect the second node and the first level signal input under the control of the input control terminal and the first level signal input terminal; also used to control to connect or disconnect the second node and the second level signal input terminal under the control of the first node and the second level signal input terminal.

14 Claims, 9 Drawing Sheets

(51) Int. Cl.
   *G09G 3/36* (2006.01)
   *H01L 27/12* (2006.01)

(56) References Cited

U.S. PATENT DOCUMENTS

| | | | |
|---|---|---|---|
| 2018/0218660 A1* | 8/2018 | Wang | G09G 3/3677 |
| 2018/0350315 A1* | 12/2018 | Zhang | G09G 3/3677 |
| 2019/0057978 A1* | 2/2019 | Kim | H01L 27/124 |
| 2019/0066604 A1* | 2/2019 | Kong | G09G 3/3291 |
| 2019/0155433 A1* | 5/2019 | Park | G06F 3/04184 |
| 2019/0279588 A1* | 9/2019 | Kim | G11C 19/28 |
| 2020/0051656 A1* | 2/2020 | Feng | G11C 19/287 |
| 2021/0020089 A1* | 1/2021 | Huang | G09G 3/3677 |
| 2021/0166647 A1* | 6/2021 | Zhao | G11C 19/28 |
| 2021/0366352 A1* | 11/2021 | Zou | G09G 3/2092 |

* cited by examiner

SHIFT REGISTER UNIT, DRIVING METHOD THEREOF, GATE DRIVING CIRCUIT, AND DISPLAY DEVICE

CROSS-REFERENCE TO RELATED APPLICATIONS

This application claims priority to Chinese Patent Application No. 202010673759.1 filed on Jul. 14, 2020, which is incorporated herein by reference in its entirety.

TECHNICAL FIELD

The present disclosure relates to the field of display technique, in particular to a shift register unit, a driving method thereof, a gate driving circuit, and a display device.

BACKGROUND

At present, a liquid crystal display (LCD) technology and an active-matrix organic light emitting diode (AMOLED) display technology are widely used in the display field. AMOLED display devices generally include: a display panel, a gate driving circuit, a data driver, and a timing controller. The display panel includes: data lines, gate lines, and pixels controlled by the data lines and the gate lines. The general working mode is that when the gate driving circuit provides a gate driving signal to a gate line, a row of pixels corresponding to the gate line receives a data voltage provided by the corresponding data line, the pixel emits light of different brightness according to the magnitude of the data voltage.

Since the pulse width of the gate driving signal provided by the gate driving circuit to the gate line is related to the working performance of the pixel driving circuit within the display panel, there is an urgent need to provide a control circuit with the pulse width modulation (PWM) function.

SUMMARY

A first aspect of the present disclosure provides a shift register unit, includes: an input circuit, respectively coupled to an input control terminal, a signal input terminal and a first node; a first capacitor circuit, a first terminal of the first capacitor circuit being coupled to a signal output terminal; an output circuit, respectively coupled to a second terminal of the first capacitor circuit, a first level signal input terminal and the signal output terminal; an output pull-down circuit, respectively coupled to a second node, the signal output terminal, and a second level signal input terminal; a coupling circuit, respectively coupled to the first level signal input terminal, the first node, and the second terminal of the first capacitor circuit; configured to control to connect or disconnect the first node and the second terminal of the first capacitor circuit under the control of the first level signal input terminal; and an inverter circuit, respectively coupled to the input control terminal, the first node, the second node, the first level signal input terminal, and the second level signal input terminal, and configured to control to connect or disconnect the second node and the first level signal input terminal under the control of the input control terminal and the first level signal input terminal, and configured to control to connect or disconnect the second node and the second level signal input terminal under the control of the first node and the second level signal input terminal.

Optionally, the shift register unit further includes a first reset circuit, respectively coupled to a reset control terminal, the first level signal input terminal and the second node; and configured to control to connect or disconnect the first level signal input terminal and the second node under the control of the reset control terminal.

Optionally, the first reset circuit comprises an eleventh transistor, a gate electrode of the eleventh transistor is coupled to the reset control terminal, and a first electrode of the eleventh transistor is coupled to the first level signal input terminal, and a second electrode of the eleventh transistor is coupled to the second node.

Optionally, the shift register unit further includes: a second reset circuit, respectively coupled to a reset control terminal, the first level signal input terminal and the first node; and configured to control to connect or disconnect the first level signal input terminal and the first node under the control of the reset control terminal.

Optionally, the second reset circuit comprises a twelfth transistor, a gate electrode of the twelfth transistor is coupled to the reset control terminal, and a first electrode of the twelfth transistor is coupled to the first level signal input terminal, and a second electrode of the twelfth transistor is coupled to the first node.

Optionally, the shift register unit further includes: a protection circuit, wherein the output pull-down circuit is coupled to a third node, and the third node is coupled to the second level signal input terminal through the protection circuit; the protection circuit is coupled to the second node, the signal output terminal, and the first level signal input terminal; the protection circuit is used to control to connect or disconnect the third node and the second level signal input terminal under the control of the second node; the protection circuit is also used to control to connect or disconnect the first level signal input terminal and the third node under the control of the signal output terminal.

Optionally, the protection circuit includes a ninth transistor and a tenth transistor; a gate electrode of the ninth transistor is coupled to the second node, a first electrode of the ninth transistor is coupled to the third node, and a second electrode of the ninth transistor is coupled to the second level signal input terminal; and a gate electrode of the tenth transistor is coupled to the signal output terminal, a first electrode of the tenth transistor is coupled to the first level signal input terminal, and a second electrode of the tenth transistor is coupled to the third node.

Optionally, the shift register unit further includes: a second capacitor circuit, a first terminal of the second capacitor circuit being coupled to the second node, a second terminal of the second capacitor circuit being coupled to the second level signal input terminal.

Optionally, the input circuit includes a first transistor, a gate electrode of the first transistor is coupled to the input control terminal, and a first electrode of the first transistor is coupled to the signal input terminal, and a second electrode of the first transistor is coupled to the first node.

Optionally, the coupling circuit includes a sixth transistor, a gate electrode of the sixth transistor is coupled to the first level signal input terminal, and a first electrode of the sixth transistor is coupled to the first node, and a second electrode of the sixth transistor is coupled to the second terminal of the first capacitor circuit.

Optionally, the output circuit includes a seventh transistor, a gate electrode of the seventh transistor is coupled to the second terminal of the first capacitor circuit, and a first terminal of the seventh transistor is connected to the first level signal input terminal, and a second electrode of the seventh transistor is coupled to the signal output terminal.

Optionally, the output pull-down circuit includes an eighth transistor, a gate electrode of the eighth transistor is coupled to the second node, and a first electrode of the eighth transistor is coupled to the signal output terminal, a second electrode of the eighth transistor is coupled to the second level signal output terminal.

Optionally, the inverter circuit includes: a second transistor, a gate electrode of the second transistor being coupled to the first level signal input terminal, and a first electrode of the second transistor being coupled to the input control terminal; a third transistor, a gate electrode of the third transistor being coupled to the first node, a first electrode of the third transistor being coupled to a second electrode of the second transistor, a second electrode of the third transistor being coupled to the second level signal input terminal; a fourth transistor, a gate electrode of the fourth transistor being coupled to the second electrode of the second transistor, and a first electrode of the fourth transistor being coupled to the first level signal input terminal, a second electrode of the fourth transistor being coupled to the second node; and a fifth transistor, a gate electrode of the fifth transistor being coupled to the first node, a first electrode of the fifth transistor being coupled to the second node, and a second electrode of the fifth transistor being coupled to the second level signal input terminal.

A second aspect of the present disclosure provides a gate driving circuit including a plurality of shift register units.

Optionally, the plurality of the shift register units are cascaded, and among adjacent shift register units, a signal output terminal of a current shift register unit is coupled to a signal input terminal of a next shift register unit, so as to provide an input signal to the next shift register unit.

Optionally, clock signals of two adjacent shift register units are inverted in phase.

A third aspect of the present disclosure provides a display device including the gate driving circuit.

A fourth aspect of the present disclosure provides a method for driving the shift register unit, includes: in a first reset phase, the signal input terminal writing a low level input signal; under the control of the input control terminal, the input circuit controlling to connect the signal input terminal and the first node; under the control of the first level signal input terminal and the input control terminal, the inverter circuit controlling to connect the first level signal input terminal and the second node; under the control of the second node, the output pull-down circuit controlling to connect the signal output terminal and the second level signal input terminal; in an initial phase, the signal input terminal writing a high level input signal; under the control of the input control terminal, the input circuit controlling to disconnect the signal input terminal and the first node; under the control of the first level signal input terminal and the input control terminal, the inverter circuit controlling to disconnect the first level signal input terminal and the second node; in a first sub-phase of an output phase, the signal input terminal continuing to write the high level input signal; under the control of the input control terminal, the input circuit controlling to connect the signal input terminal and the first node; under the control of the first node and the second level signal input terminal, the inverter circuit controlling to connect the second node and the second level signal input terminal; under the control of the second node, the output pull-down circuit controlling to disconnect the signal output terminal and the second level signal input terminal; under the control of the first level signal input terminal, the coupling circuit controlling to connect the first node and the second terminal of the first capacitor circuit; under the control of the second terminal of the first capacitor circuit, the output circuit controlling to connect the first level signal input terminal and the signal output terminal; in a second sub-phase of the output phase, the signal input terminal writing a low level input signal; under the control of the input control terminal, the input circuit controlling to disconnect the signal input terminal and the first node, under the action of the first capacitor circuit, the potential of the first node continuing to be maintained at a potential in the first sub-phase; under the control of the first level signal input terminal, the coupling circuit continuing to control to connect the first node and the second terminal of the first capacitor circuit; under the control of the second terminal of the first capacitor circuit, the output circuit continuing to control to connect the first level signal input terminal and the signal output terminal; in a second reset phase and a maintenance phase, the signal input terminal continuing to write the low level input signal; under the control of the input control terminal, the input circuit controlling connect the signal input terminal and the first node; under the control of the first level signal input terminal and the input control terminal, the inverter circuit controlling to connect the first level signal input terminal and the second node; under the control of the second node, the output pull-down circuit controlling to connect the signal output terminal and the second level signal input terminal.

A fifth aspect of the present disclosure provides a method for driving the shift register unit, includes: in a first reset phase, the signal input terminal writing a high level input signal; under the control of the input control terminal, the input circuit controlling to connect the signal input terminal and the first node; under the control of the first node and the second level signal input terminal, the inverter circuit controlling to connect the second node and the second level signal input terminal; under the control of the second node, the output pull-down circuit controlling to disconnect the signal output terminal and the second level signal input terminal; under the control of the first level signal input terminal, the coupling circuit controlling to connect the first node and the second terminal of the first capacitor circuit; under the control of the second terminal of the first capacitor circuit, the output circuit controlling to connect the first level signal input terminal and the signal output terminal; in an initial phase, the signal input terminal writing a low level input signal; under the control of the input control terminal, the input circuit controlling to disconnect the signal input terminal and the first node; under the control of the first node and the second level signal input terminal, the inverter circuit controlling to connect the second node and the second level signal input terminal; under the control of the second node, the output pull-down circuit controlling to disconnect the signal output terminal and the second level signal input terminal; under the control of the first level signal input terminal, the coupling circuit controlling to connect the first node and the second terminal of the first capacitor circuit; under the control of the second terminal of the first capacitor circuit, the output circuit controlling to connect the first level signal input terminal and the signal output terminal; in a first sub-phase of an output phase, the signal input terminal continuing to write the low level input signal; under the control of the input control terminal, the input circuit controlling to connect the signal input terminal and the first node; under the control of the first level signal input terminal and the input control terminal, the inverter circuit controlling to connect the first level signal input terminal and the second node; under the control of the second node, the output pull-down circuit controlling to connect the signal output terminal and the second level signal input terminal; in a second sub-phase of the output phase, the signal input terminal writing a high level input signal; under the control of the input control terminal, the input circuit controlling to disconnect the signal input terminal and the first node, under the action of the first capacitor circuit, the potential of the first node continuing to be maintained at a potential in the first sub-phase; under the control of the first level signal input terminal and the input control terminal, the inverter circuit continuing to control to connect the first level signal input terminal and the second node; under the control of the second node, the output pull-down circuit controlling to connect the signal output terminal and the second level signal input terminal; and in a second reset phase and a maintenance phase, the signal input terminal continuing to write a high level input signal; under the control of the input control terminal, the input circuit controlling to connect the signal input terminal and the first node; under the control of the first node and the second level signal input terminal, the inverter circuit controlling to connect the second node and the second level signal input terminal, under the control of the second node, the output pull-down circuit controlling to disconnect the signal output terminal and the second level signal input terminal; under the control of the first level signal input terminal, the coupling circuit controlling to connect the first node and the second terminal of the first capacitor circuit; under the control of the second terminal of the first capacitor circuit, the output circuit controlling to connect the first level signal input terminal and the signal output terminal.

BRIEF DESCRIPTION OF THE DRAWINGS

The drawings, which are illustrated herein, are to provide a further understanding of the disclosure and constitute a part of the disclosure. Embodiments of the disclosure together with the description serve to explain the disclosure and are not used to limit the disclosure. In the drawings.

DETAILED DESCRIPTION

In order to further explain the pixel driving circuit, the manufacturing method thereof and the display device provided by the embodiments of the present disclosure, the following detailed description is made with reference to the accompanying drawings.

Figure 1:
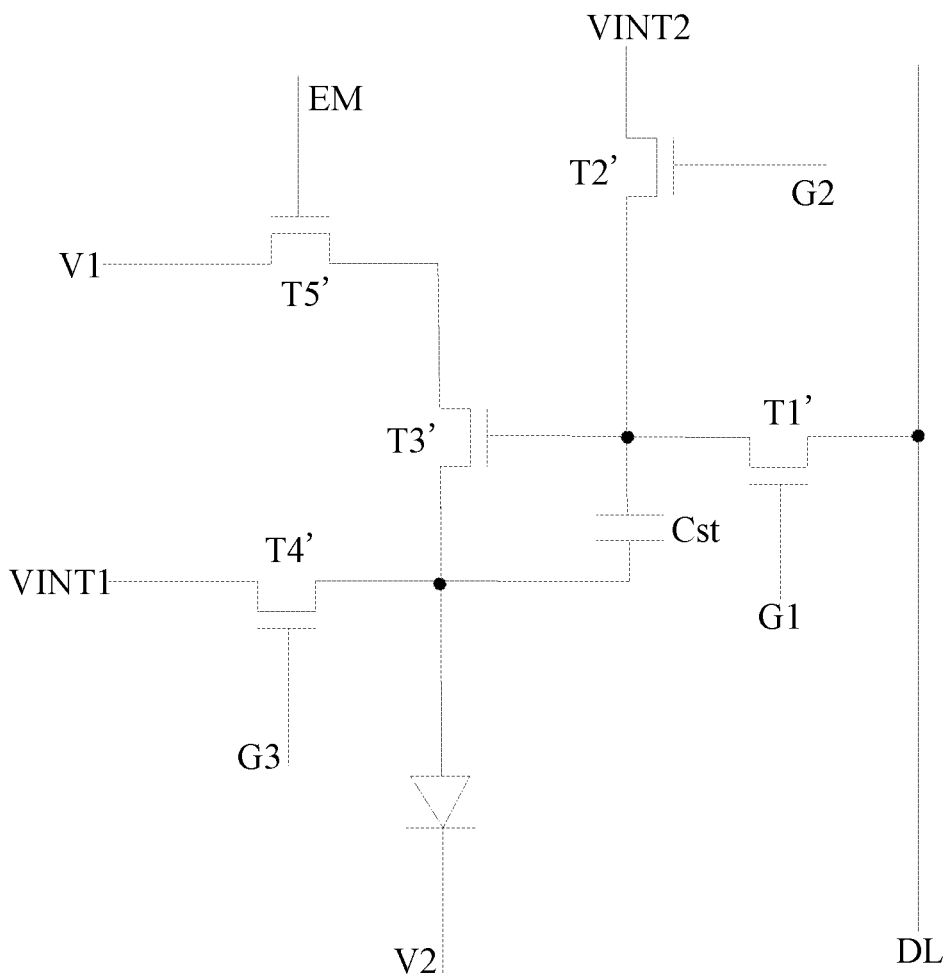
FIG. 1 is a schematic structural diagram of an internal pixel circuit provided by an embodiment of the disclosure.
Figure 2:
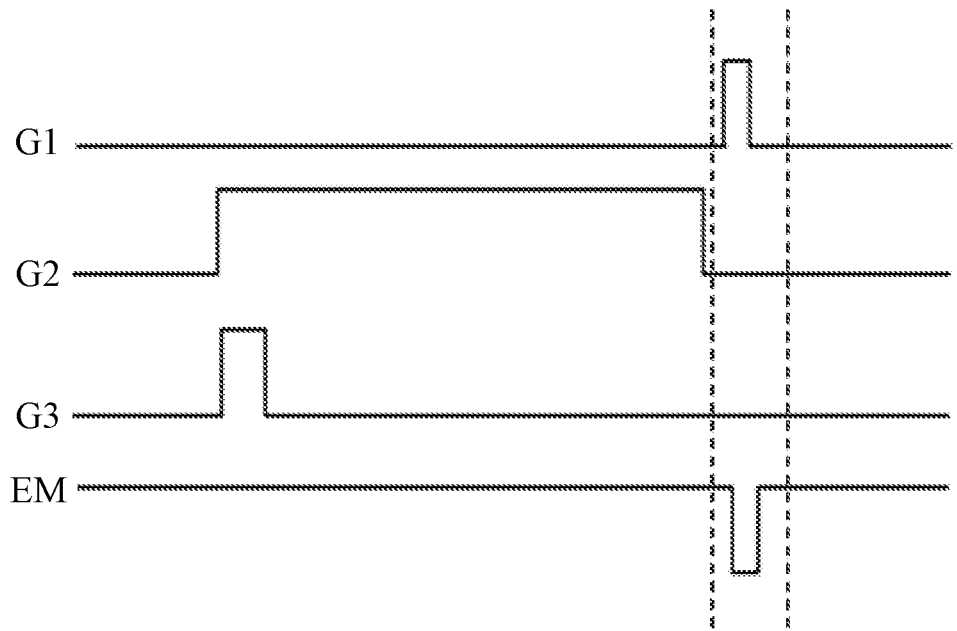
FIG. 2 is a driving timing diagram of an internal pixel circuit provided by an embodiment of the disclosure.

As shown in FIG. 1 and FIG. 2, FIG. 1 shows an internal pixel circuit of a 5T1C (that is, including five driving transistors and one capacitor) using N-type thin film transistors. FIG. 2 is a driving timing diagram corresponding to the internal pixel circuit. In FIG. 1, VINT1 represents a first reset signal, VINT2 represents a second reset signal, V1 represents a positive power signal, such as VDD, V2 represents a negative power signal, such as VSS, DL represents a data signal, and G1 represents a first scan signal, G2 represents a second scan signal, G3 represents a third scan signal, EM represents a light emitting control signal, and Cst represents a storage capacitor. T1', T2', T4', and T5' represent switching transistors, and T3' represents a driving transistor. A gate electrode of the driving transistor is coupled to T1', a drain electrode of the driving transistor is coupled to T5', and a source electrode of the driving transistor is coupled to T4'.

In FIG. 2, a period between the two dotted lines is a data writing period, the pulse width of the second scan signal G2 is related to a threshold voltage of the driving transistor, and the light emitting control signal EM is related to a light emitting time length of the light emitting element. Therefore, the second scan signal G2 and the light emitting control signal EM can affect the working performance of the internal pixel circuit.

Therefore, there is an urgent need to provide a control circuit with a PWM function to provide the second scan signal G2 and the light emitting control signal EM with adjustable pulse widths.

Figure 3:
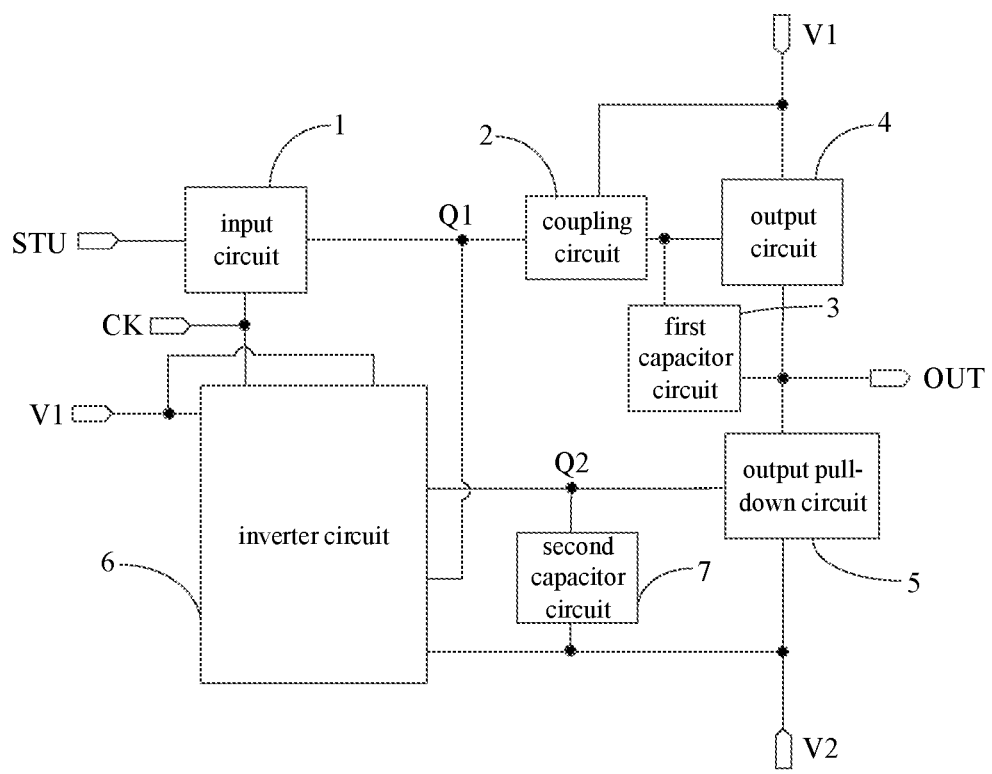
FIG. 3 is a schematic circuit diagram of a shift register unit provided by an embodiment of the disclosure.

Referring to FIG. 3, an embodiment of the present disclosure provides a shift register unit, including: an input circuit 1, respectively coupled to an input control terminal CK, a signal input terminal STU and a first node Q1; a first capacitor circuit 3, a first terminal of the first capacitor circuit 3 being coupled to a signal output terminal OUT; an output circuit 4, respectively coupled to a second terminal of the first capacitor circuit 3, a first level signal input terminal V1 and the signal output terminal OUT; an output pull-down circuit 5, respectively coupled to a second node Q2, the signal output terminal OUT, and a second level signal input terminal V2; a coupling circuit 2, respectively coupled to the first level signal input terminal V1, the first node Q1, and the second terminal of the first capacitor circuit 3; configured to control to connect or disconnect the first node Q1 and the second terminal of the first capacitor circuit 3 under the control of the first level signal input terminal V1; an inverter circuit 6, respectively coupled to the input control terminal CK, the first node Q1, the second node Q2, the first level signal input terminal V1, and the second level signal input terminal V2, and configured to control to connect or disconnect the second node Q2 and the first level signal input terminal V1 under the control of the input control terminal CK and the first level signal input terminal V1, and configured to control to connect or disconnect the second node Q2 and the second level signal input terminal V2 under the control of the first node Q1 and the second level signal input terminal V2.

A working period of the above-mentioned shift register unit sequentially includes: a first reset phase P1, an initial phase P2, an output phase P3, a second reset phase P4, and a maintenance period P5. Two specific driving modes are given below.

Figure 5:
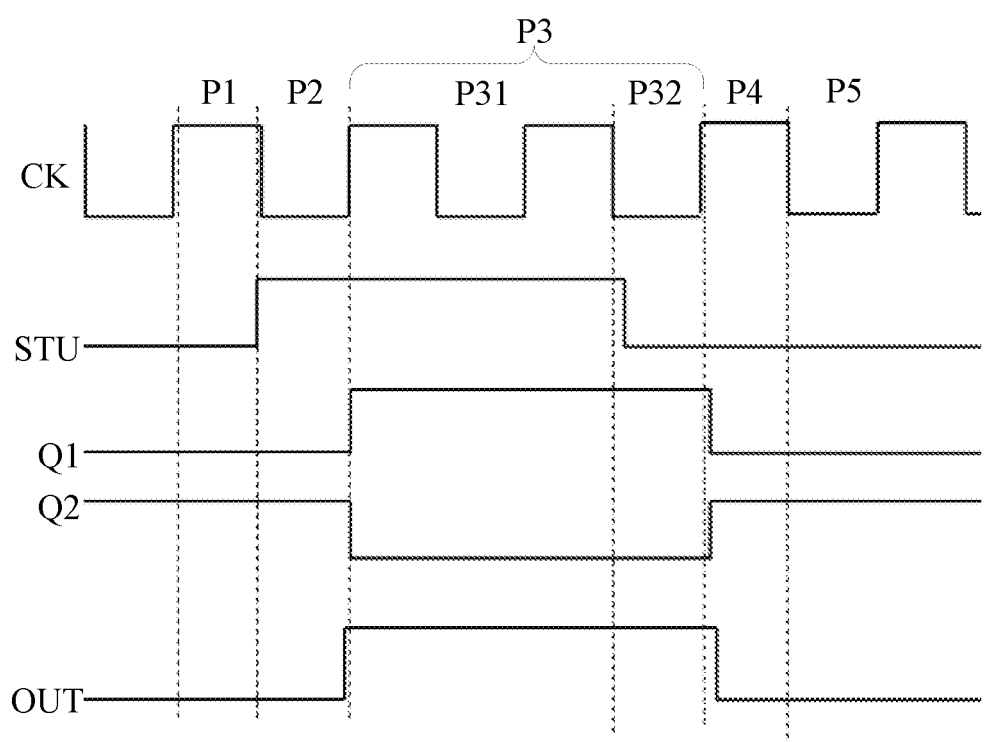
FIG. 5 is a driving timing diagram corresponding to the structure of FIG. 4.

As shown in FIG. 5, in the first driving mode, the working process of the shift register unit in a working period is as follows.

In the first reset phase P1, the input signal written in the signal input terminal STU is a low level; the input control terminal CK writes a high level clock signal, and under the control of the high level clock signal, the input circuit 1 controls to connect the signal input terminal STU and the first node Q1, the low level input signal is transmitted to the first node Q1; under the control the first level signal input terminal V1 and the input control terminal CK, the inverter circuit 6 controls to connect the first level signal input terminal V1 and the second node Q2, and transmits the first level signal inputted from the first level signal input terminal V1 to the second node Q2; under the control of the second node Q2, the output pull-down circuit 5 controls to connect the signal output terminal OUT and the second level signal input terminal V2, and pulls down the potential of the signal output terminal OUT to a low level.

In the initial phase P2, the signal input terminal STU starts to write a high level input signal; the input control terminal CK writes a low level clock signal, and under the control of the low level clock signal, the input circuit 1 controls to disconnect the signal input terminal STU and the first node Q1 to keep the first node Q1 at a low level; under the control of the first level signal input terminal V1 and the input control terminal CK, the inverter circuit 6 controls to disconnect the first level signal input terminal V1 and the second node Q2, and keep the potential of the signal output terminal OUT to be a low level.

In a first sub-phase P31 of the output phase P3, the signal input terminal STU continues to write a high level input signal; under the control of the input control terminal CK, the input circuit 1 controls to connect the signal input terminal STU and the first node Q1, to pull up the potential of the first node Q1 to a high level, when the low level clock signal is written into the input control terminal CK, under the control of the low level clock signal, the input circuit 1 controls to disconnect the signal input terminal and the first node Q1, to keep the first node Q1 at a high level; under the control of the first node Q1 and the second level signal input terminal V2, the inverter circuit 6 controls to connect the second node Q2 and the second level signal input terminal V2 to pull down the potential of the second node Q2; under the control of the second node Q2, the output pull-down circuit 5 controls to disconnect the signal output terminal OUT and the second level signal input terminal V2; under the control of the first level signal input terminal V1, the coupling circuit 2 controls the conduction between the first node Q1 and a second terminal of the first capacitor circuit 3; under the control of the second terminal of the first capacitor circuit 3, the output circuit 4 controls to connect the first level signal input terminal V1 and the signal output terminal OUT, to pull up the potential of the signal output terminal OUT to a high level.

In a second sub-phase P32 of the output phase P3, the signal input terminal STU writes a low level input signal; the input control terminal CK writes a low level clock signal, and under the control of the low level clock signal, the input circuit 1 controls to disconnect the signal input terminal STU and the first node Q1, and under the control of the first capacitor circuit 3, the potential of the first node Q1 continues to be maintained at a high level; at the same time, the potential of the signal output terminal OUT is a high level.

In the second reset phase P4 and the maintenance phase P5, the input signal written by the signal input terminal STU is a low level; the input control terminal CK writes a high level clock signal, under the control of the high level clock signal, the input circuit 1 controls to connect the signal input terminal and the first node Q1, transmits a low level input signal to the first node Q1, and pulls down the potential of the first node Q1; under the control of the first level signal input terminal V1 and the input control terminal CK, the inverter circuit 6 controls to connect the first level signal input terminal V1 and the second node Q2; under the control of the second node Q2, the output pull-down circuit 5 controls to connect the signal output terminal OUT and the second level signal input terminal V2.

Figure 8:
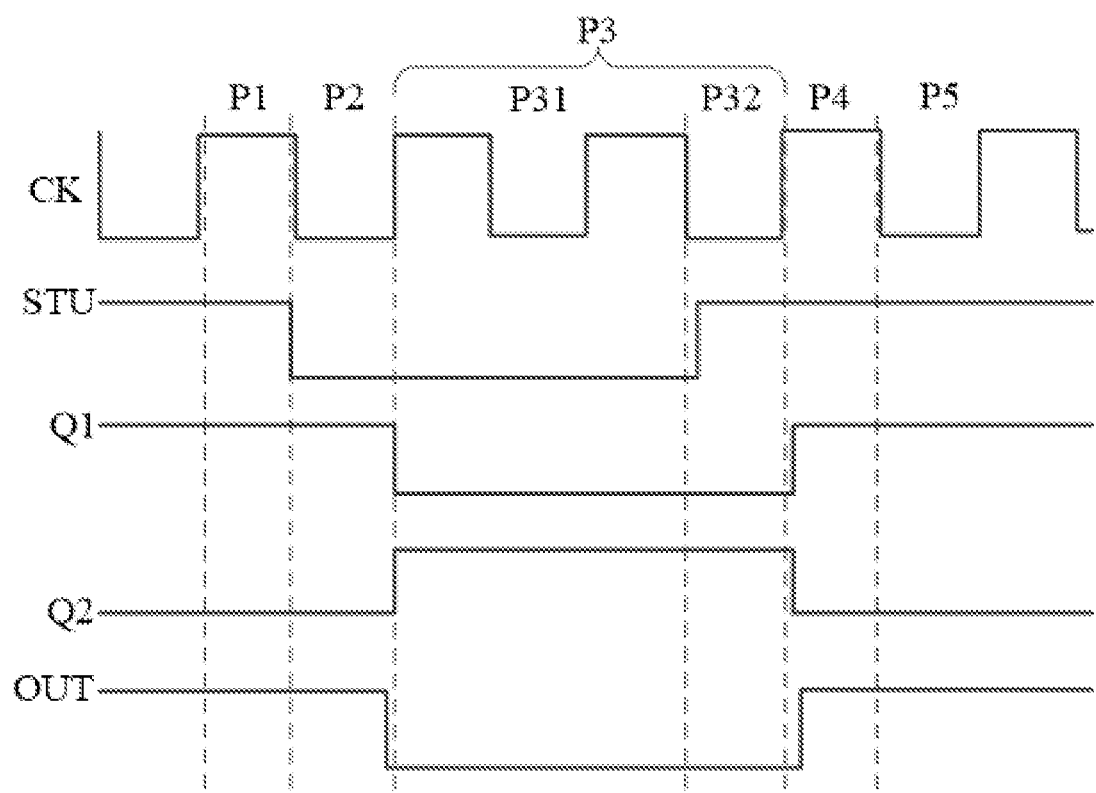
FIG. 8 is a driving timing diagram corresponding to the structure of FIG. 7.

As shown in FIG. 8, in the second driving mode, the working process of the shift register unit in one working period is as follows.

In the first reset phase P1, the signal input terminal STU writes a high level input signal; under the control of the input control terminal CK, the input circuit 1 controls to connect the signal input terminal STU and the first node Q1, transmits the high level input signal to the first node Q1; under the control of the first node Q1 and the second level signal input terminal V2, the inverter circuit 6 controls to connect the second node Q2 and the second level signal input terminal V2, transmits the second level signal written in the second level signal input terminal V2 to the second node Q2; under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3, and transmit the high level input signal to the second terminal of the first capacitor circuit 3; under the control of the second terminal of the first capacitor circuit 3, the output circuit 4 controls to connect the first level signal input terminal V1 and the signal output terminal OUT.

In the initial phase P2, the signal input terminal STU writes a low level input signal; under the control of the input control terminal CK, the input circuit 1 controls to disconnect the signal input terminal STU and the first node Q1, the first node Q1 continues to maintain at a high level; under the control of the first node Q1 and the second level signal input terminal V2, the inverter circuit 6 continues to control to connect the second node Q2 and the second level signal input terminal V2; under the control of the second node Q2, the output pull-down circuit 5 continues to control to disconnect the signal output terminal OUT and the second level signal input terminal V2, under the control of the first level signal input terminal V1, the coupling circuit 2 continues to control to connect the first node Q1 and the second terminal of the first capacitor circuit 3; under the control of the second terminal of the first capacitor circuit 3, the output circuit 4 controls to connect the first level signal input terminal V1 and the signal output terminal OUT.

In the first sub-phase P31 of the output phase P3, the signal input terminal STU continues to write a low level input signal; under the control of the input control terminal CK, the input circuit 1 controls to connect the signal input terminal STU and the first node Q1, transmit the low level input signal to the first node Q1; under the control of the first level signal input terminal V1 and the input control terminal CK, the inverter circuit 6 controls to connect the first level signal input terminal V1 and the second node Q2; under the control of the second node Q2, the output pull-down circuit 5 controls to connect the signal output terminal OUT and the second level signal input terminal V2.

In the second sub-phase P32 of the output phase P3, the signal input terminal STU writes a high level input signal; under the control of the input control terminal CK, the input circuit 1 controls to disconnect the signal input terminal STU and the first node Q1, under the action of the first capacitor circuit 3, the potential of the first node Q1 continues to be maintained at the low level in the first sub-phase P31; under the control of the first level signal input terminal V1 and the input control terminal CK, the inverter circuit 6 continues to control to connect the first level signal input terminal V1 and the second node Q2; under the control of the second node Q2, the output pull-down circuit 5 controls to connect the signal output terminal OUT and the second level signal input terminal V2.

In the second reset phase P4 and the maintenance phase P5, the signal input terminal STU continues to write a high level input signal; under the control of the input control terminal CK, the input circuit 1 controls to connect the signal input terminal STU and the first node Q1, transmit the high level input signal to the first node Q1; under the control of the first node Q1 and the second level signal input terminal V2, the inverter circuit 6 controls to connect the second node Q2 and the second level signal input terminal V2; under the control of the second node Q2, the output pull-down circuit 5 controls to disconnect the signal output terminal OUT and the second node Q2; under the control of the first level signal input terminal V1, the coupling circuit 2 controls to connect the first node Q1 and the second terminal of the first capacitor circuit 3, under the control of the second terminal of the first capacitor circuit 3, the output circuit 4 controls to connect the first level signal input terminal V1 and the signal output terminal OUT.

Exemplarily, the input control signal written by the input control terminal CK is a clock signal; the first level signal written by the first level signal input terminal V1 is a high level signal, such as a positive power signal; the second level signal written by the second level signal input terminal V2 is a low level signal.

Exemplarily, when the shift register unit is driven by the first driving mode, the G2 signal as shown in FIG. 2 can be obtained, and when the shift register unit is driven by the second driving mode, the EM signal as shown in FIG. 2 can be obtained.

According to the specific structure and working process of the shift register unit described above, in the shift register unit provided by the embodiment of the present disclosure, the pulse width of the signal outputted by the signal output terminal OUT can be controlled by controlling the pulse width of the input signal. Therefore, the shift register unit provided by the embodiment of the present disclosure can realize the PWM function of the output signal. In this way, when the shift register unit provided by the embodiment of the present disclosure is used to output the second scan signal G2 and the light emitting control signal EM, the pulse widths of the second scan signal G2 and the light emitting control signal EM can be adjusted as required, which ensures the working performance of the internal pixel circuit.

Figure 4:
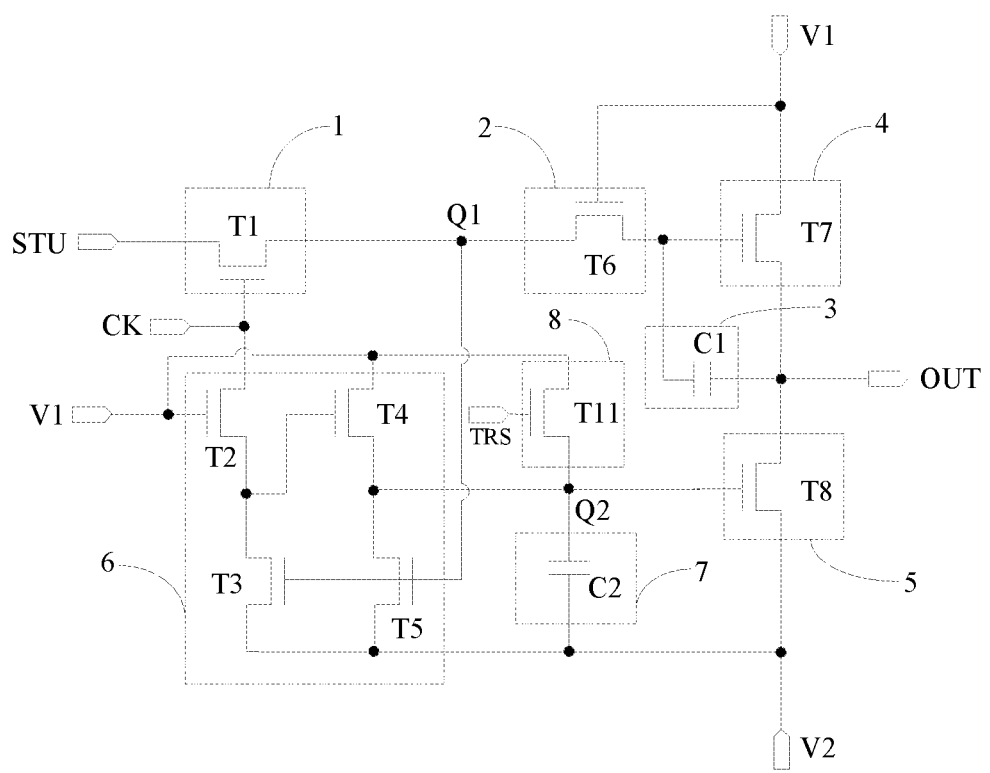
FIG. 4 is a schematic diagram of a first structure of a shift register unit provided by an embodiment of the disclosure.
Figure 6:
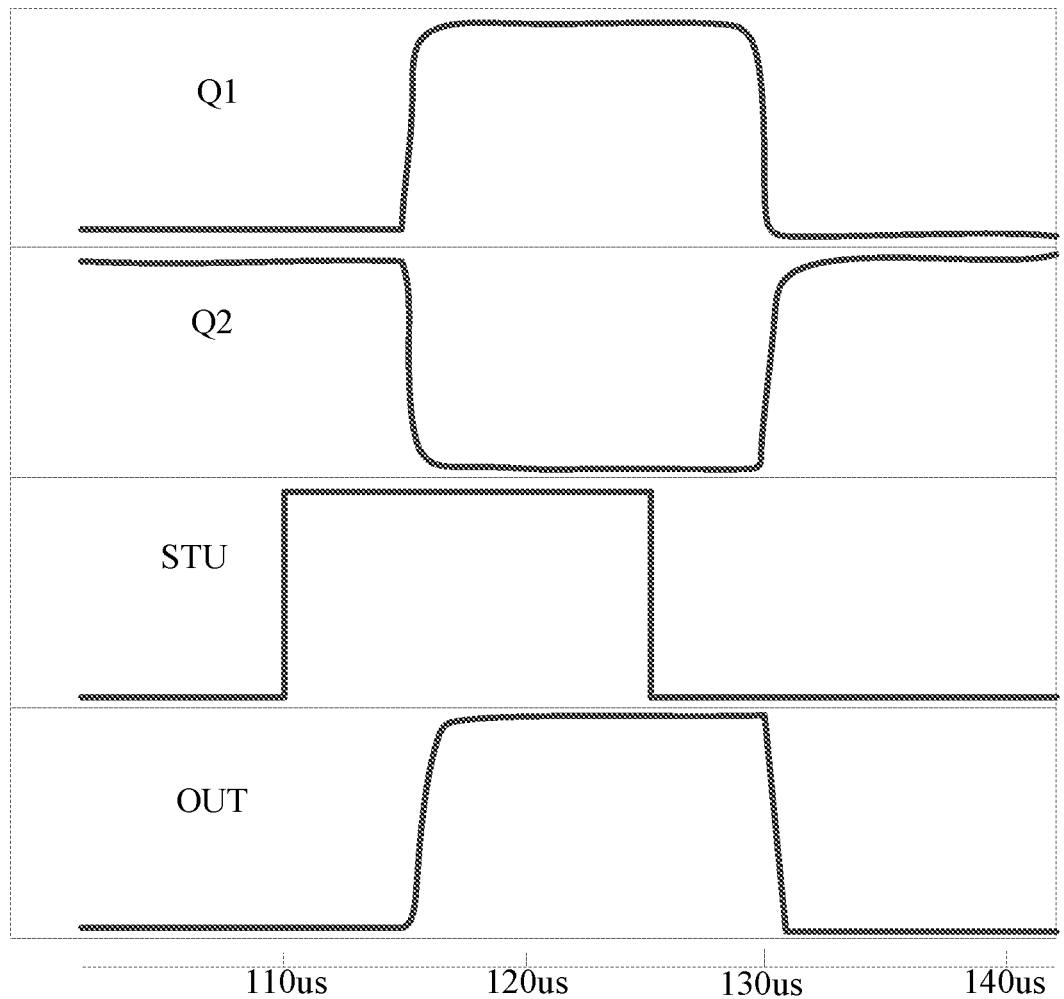
FIG. 6 is a schematic diagram of signal simulation corresponding to the structure of FIG. 4.

As shown in FIGS. 4 to 6, in some embodiments, the shift register unit further includes: a first reset circuit 8, respectively coupled to the reset control terminal TRS, the first level signal input terminal V1 and the second node Q2; and configured to control to connect or disconnect the first level signal input terminal V1 and the second node Q2 under the control of the reset control terminal TRS.

In the first reset phase P1, under the control of the reset control terminal TRS, the first reset circuit 8 controls to connect the first level signal input terminal V1 and the second node Q2 to reset the second node Q2. In the remaining phase except for the first reset phase P1, under the control of the reset control terminal TRS, the first reset circuit 8 controls to disconnect the first level signal input terminal V1 and the second node Q2.

Exemplarily, the first reset circuit 8 is applicable to the case where the shift register unit is driven by the first driving mode.

In some embodiments, the first reset circuit 8 includes an eleventh transistor T11, a gate electrode of the eleventh transistor T11 is coupled to the reset control terminal TRS, and a first electrode of the eleventh transistor T11 is coupled to the first level signal input terminal V1, and a second electrode of the eleventh transistor T11 is coupled to the second node Q2.

In the first reset phase P1, under the control of the reset control terminal TRS, the eleventh transistor T11 is turned on, thereby controlling to connect the first level signal input terminal V1 and the second node Q2, so as to reset the second node Q2. In the remaining period except for the first reset phase P1, under the control of the reset control terminal TRS, the eleventh transistor T11 is turned off, thereby controlling to disconnect the first level signal input terminal V1 and the second node Q2.

Figure 7:
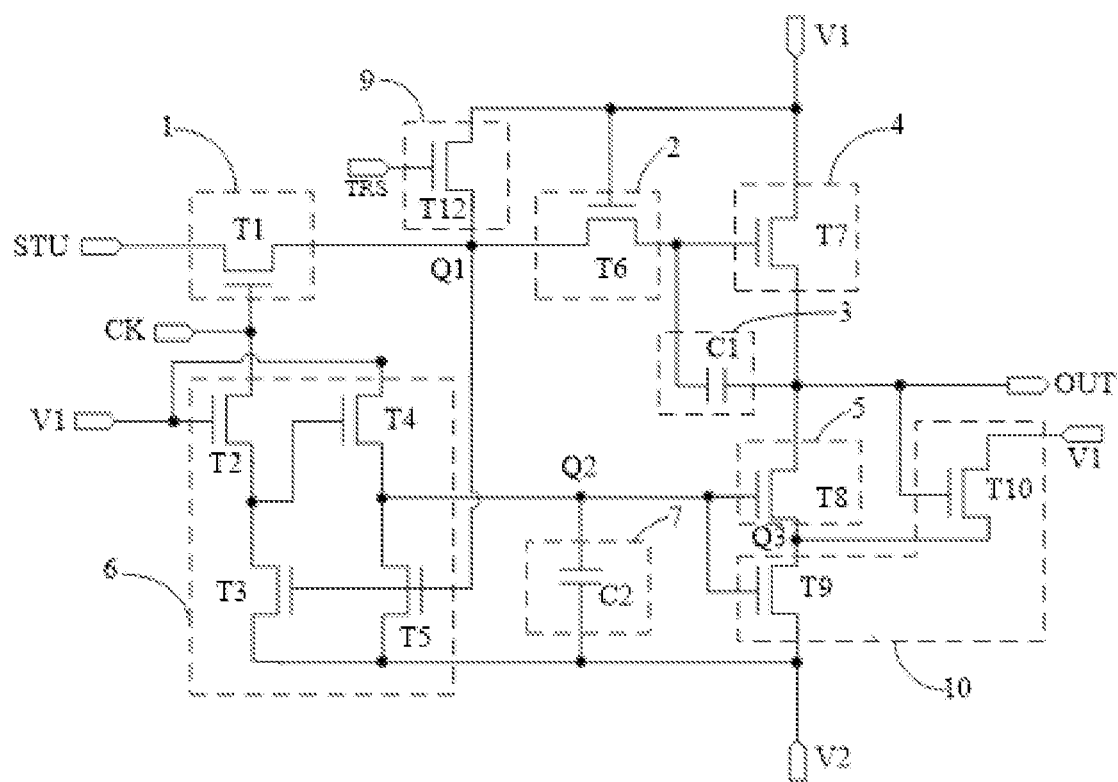
FIG. 7 is a schematic diagram of a second structure of a shift register unit provided by an embodiment of the disclosure.
Figure 9:
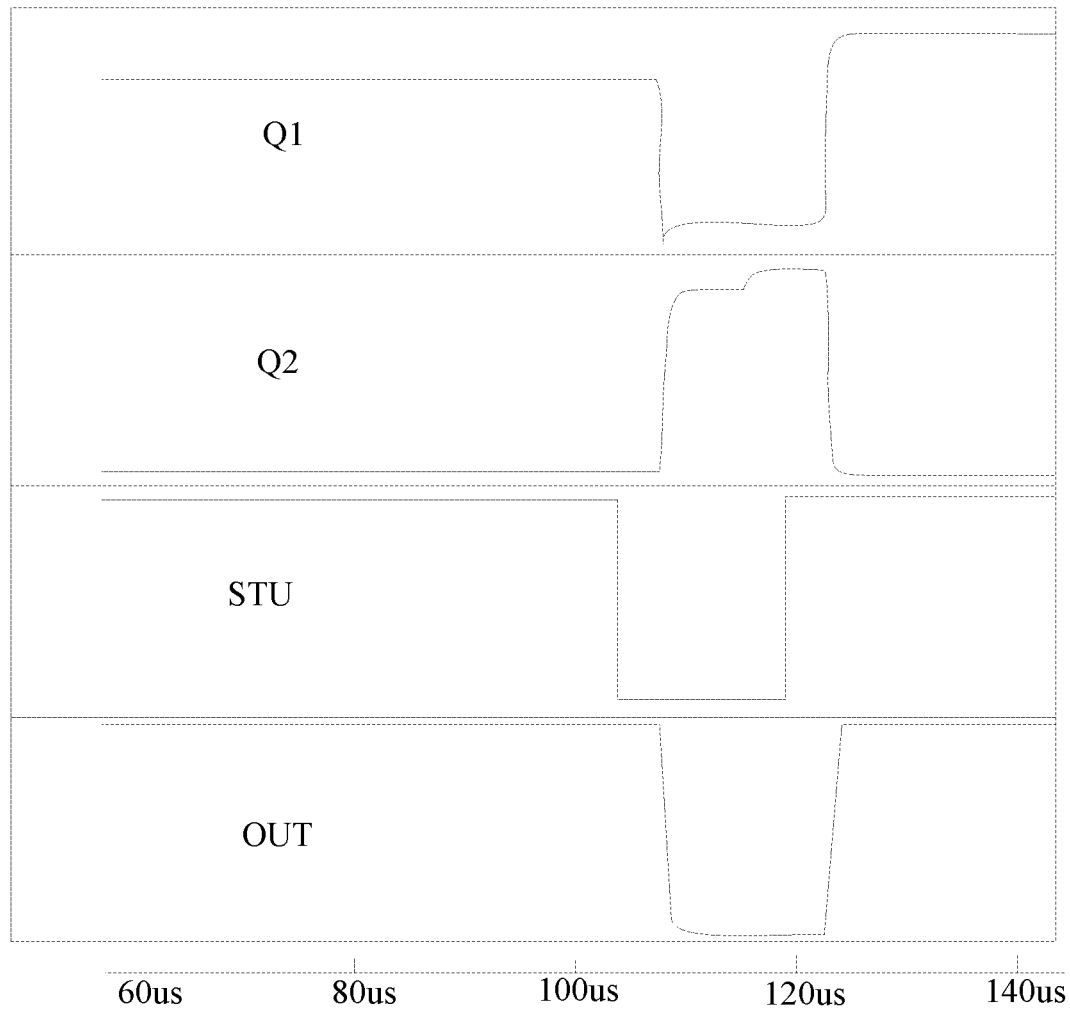
FIG. 9 is a schematic diagram of signal simulation corresponding to the structure of FIG. 7.

As shown in FIGS. 7-9, in some embodiments, the shift register unit further includes: a second reset circuit 9, respectively coupled to the reset control terminal TRS, the first level signal input terminal V1 and the first node Q1; and configured to control to connect or disconnect the first level signal input terminal V1 and the first node Q1 under the control of the reset control terminal TRS.

In the first reset phase P1, under the control of the reset control terminal TRS, the second reset circuit 9 controls to connect the first level signal input terminal V1 and the first node Q1 to reset the first node Q1. In the remaining period except for the first reset phase P1, under the control of the reset control terminal TRS, the second reset circuit 9 controls to disconnect the first level signal input terminal V1 and the first node Q1.

Exemplarily, the second reset circuit 9 is applicable to the case where the shift register unit is driven by the second driving mode.

In some embodiments, the second reset circuit 9 includes a twelfth transistor T12, a gate electrode of the twelfth transistor T12 is coupled to the reset control terminal TRS, and a first electrode of the twelfth transistor T12 is coupled to the first level signal input terminal V1, and the second electrode of the twelfth transistor T12 is coupled to the first node Q1.

In the first reset phase P1, under the control of the reset control terminal TRS, the twelfth transistor T12 is turned on, thereby controlling to connect the first level signal input terminal V1 and the first node Q1, so as to reset the first node Q1. In the remaining period except for the first reset phase P1, under the control of the reset control terminal TRS, the twelfth transistor T12 is turned off, thereby controlling to disconnect the first level signal input terminal V1 and the first node Q1.

As shown in FIGS. 7 and 8, in some embodiments, the shift register unit further includes: a protection circuit 10.

The output pull-down circuit 5 is coupled to a third node Q3, and the third node Q3 is coupled to the second level signal input terminal V2 through the protection circuit 10; the protection circuit 10 is also coupled to the second node Q2, the signal output terminal OUT, and the first level signal input terminal V1; the protection circuit 10 is used to control to connect or disconnect the third node Q3 and the second level signal input terminal V2 under the control of the second node Q2; the protection circuit 10 is also used to control to connect or disconnect the first level signal input terminal V1 and the third node Q3 under the control of the signal output terminal OUT.

In the first reset phase P1, the initial phase P2, the second reset phase P4, and the maintenance phase P5, under the control of the second node Q2, the protection circuit 10 controls to disconnect the third node Q3 and the second level signal output terminal OUT; under the control of the signal output terminal OUT, the protection circuit 10 controls to connect the first level signal input terminal V1 and the third node Q3.

In the output phase P3, under the control of the second node Q2, the protection circuit 10 controls to connect the third node Q3 and the second level signal output terminal OUT; under the control of the signal output terminal OUT, the protection circuit 10 controls to disconnect the first level signal input terminal V1 and the third node Q3.

Exemplarily, the protection circuit 10 is applicable to the case where the shift register unit is driven by the second driving mode.

The protection circuit 10 described above can prevent the shift register unit from leaking current in the first reset phase P1, the initial phase P2, the second reset phase P4, and the maintenance phase P5.

In some embodiments, the protection circuit 10 includes a ninth transistor T9 and a tenth transistor T10.

A gate electrode of the ninth transistor T9 is coupled to the second node Q2, a first electrode of the ninth transistor T9 is coupled to the third node Q3, and a second electrode of the ninth transistor T9 is coupled to the second level signal input terminal V2.

A gate electrode of the tenth transistor T10 is coupled to the signal output terminal OUT, a first electrode of the tenth transistor T10 is coupled to the first level signal input terminal V1, and a second electrode of the tenth transistor T10 is coupled to the third node Q3.

In the first reset phase P1, the initial phase P2, the second reset phase P4, and the maintenance phase P5, under the control of the second node Q2, the ninth transistor T9 is turned off, thereby controlling to disconnect the third node Q3 and the second level signal output terminal OUT; under the control of the signal output terminal OUT, the tenth transistor T10 is turned on, thereby controlling to connect the first level signal input terminal V1 and the third node Q3.

In the output period P3, under the control of the second node Q2, the ninth transistor T9 is turned on, thereby controlling to connect the third node Q3 and the second level signal output terminal OUT; under the control of the signal output terminal OUT, the tenth transistor T10 is turned off, thereby controlling to disconnect the first level signal input terminal V1 and the third node Q3.

As shown in FIGS. 4 and 7, in some embodiments, the shift register unit further includes: a second capacitor circuit 7, a first terminal of the second capacitor circuit 7 being coupled to the second node Q2, a second terminal of the second capacitor circuit 7 being coupled to the second level signal input terminal V2.

Exemplarily, the second capacitor circuit 7 includes a second capacitor C2, a first electrode plate of the second capacitor C2 is coupled to the second node Q2, and a second electrode plate of the second capacitor C2 is coupled to the second level signal input terminal V2.

The above-mentioned second capacitor circuit 7 can achieve a voltage stabilizing effect on the second node Q2, so that the shift register unit has a stable working state.

As shown in FIGS. 4 and 7, in some embodiments, the input circuit 1 includes a first transistor T1, a gate electrode of the first transistor T1 is coupled to the input control terminal CK, and a first electrode of the first transistor T1 is coupled to the signal input terminal STU, and a second electrode of the first transistor T1 is coupled to the first node Q1.

The coupling circuit 2 includes a sixth transistor T6, a gate electrode of the sixth transistor T6 is coupled to the first level signal input terminal V1, and a first electrode of the sixth transistor T6 is coupled to the first node Q1, and a second electrode of the sixth transistor T6 is coupled to the second terminal of the first capacitor circuit 3.

The output circuit 4 includes a seventh transistor T7, a gate electrode of the seventh transistor T7 is coupled to the second terminal of the first capacitor circuit 3, and a first terminal of the seventh transistor T7 is connected to the first level signal input terminal V1, and a second electrode of the seventh transistor T7 is coupled to the signal output terminal OUT.

The output pull-down circuit 5 includes an eighth transistor T8, a gate electrode of the eighth transistor T8 is coupled to the second node Q2, and a first electrode of the eighth transistor T8 is coupled to the signal output terminal OUT, a second electrode of the eighth transistor T8 is coupled to the second level signal output terminal V2.

Specifically, the input control terminal CK writes a clock signal, and the first transistor T1 is turned on or off under the control of the clock signal, so as to connect or disconnect the signal input terminal and the first nodes Q. Exemplarily, when the clock signal is at a high level, the first transistor T1 is turned on, and when the clock signal is at a low level, the first transistor T1 is turned off.

It is worth noting that the input circuit 1 can also have a reset function at the same time to realize the reset of the first node Q1, thereby achieving the purpose of simplifying the structure of the shift register unit and optimizing the display frame.

The sixth transistor T6 is turned on or off under the control of the first level signal input terminal V1. Exemplarily, when the first level signal inputted by the first level signal input terminal V1 is at a high level, the sixth transistor T6 is turned on, and when the first level signal is at a low level, the sixth transistor T6 is turned off.

The seventh transistor T7 is turned on or off under the control of the second terminal of the first capacitor circuit 3. Exemplarily, when the potential of the second terminal of the first capacitor circuit 3 is at a high level, the seventh transistor T7 is turned on, and when the potential of the second terminal of the first capacitor circuit 3 is at a low level, the seventh transistor T7 is turned off.

Exemplarily, the first capacitor circuit 3 includes a first capacitor C1, a first electrode plate of the first capacitor C1 is coupled to the signal output terminal OUT, and a second electrode plate of the first capacitor C1 is coupled the gate electrode of the seventh transistor T7.

The eighth transistor T8 is turned on or off under the control of the second node Q2. Exemplarily, when the potential of the second node Q2 is at a high level, the eighth transistor T8 is turned on, and when the potential of the second node Q2 is at a low level, the eighth transistor T8 is turned off.

As shown in FIGS. 4 and 7, in some embodiments, the inverter circuit 6 includes: a second transistor T2, a gate electrode of the second transistor T2 being coupled to the first level signal input terminal V1, and a first electrode of the second transistor T2 being coupled to the input control terminal CK; a third transistor T3, a gate electrode of the third transistor T3 being coupled to the first node Q1, a first electrode of the third transistor T3 being coupled to a second electrode of the second transistor T2, a second electrode of the third transistor T3 being coupled to the second level signal input terminal V2; a fourth transistor T4, a gate electrode of the fourth transistor T4 being coupled to the second electrode of the second transistor T2, and a first electrode of the fourth transistor T4 being coupled to the first level signal input terminal V1, a second electrode of the fourth transistor T4 being coupled to the second node Q2; a fifth transistor T5, a gate electrode of the fifth transistor T5 being coupled to the first node Q1, a first electrode of the fifth transistor T5 being coupled to the second node Q2, and a second electrode of the fifth transistor T5 being coupled to the second level signal input terminal V2.

In the first reset phase P1, under the control of the first level signal input terminal V1, the second transistor T2 is turned on, and the high level clock signal written by the input control terminal CK is transmitted to the gate electrode of the fourth transistor T4, so that the fourth transistor T4 is controlled to be turned on, and the first level signal inputted by the first level signal input terminal V1 is transmitted to the second node Q2.

In the initial phase P2, under the control of the first level signal input terminal V1, the second transistor T2 is turned on, and the low level clock signal written by the input control terminal CK is transmitted to the gate electrode of the fourth transistor T4, thereby controlling the fourth transistor T4 to be turned off and disconnecting the first level signal input terminal V1 and the second node Q2.

In the output phase P3, under the control of the first node Q1, the third transistor T3 and the fifth transistor T5 are turned on, thereby controlling to connect the second node Q2 and the second level signal input terminal V2.

In the second reset phase P4, under the control of the first level signal input terminal V1, the second transistor T2 is turned on, and the high level clock signal written by the input control terminal CK is transmitted to the gate electrode of the fourth transistor T4, so that the fourth transistor T4 is controlled to be turned on, and transmit the first level signal inputted from the first level signal input terminal V1 to the second node Q2.

In the maintenance phase P5, the second node Q2 is maintained at the potential of the second reset phase P4.

When the inverter circuit 6 adopts the above structure, it can realize the common control of the potential of the second node Q2 through the first level signal input terminal V1, the input control terminal CK and the first node Q1, thereby greatly optimizing the circuit structure of the shift register unit.

The embodiments of the present disclosure also provide a gate driving circuit, which includes a plurality of shift register units provided in the above-mentioned embodiments.

In the shift register unit provided by the above embodiment, the pulse width of the signal outputted by the signal output terminal OUT can be controlled by controlling the pulse width of the input signal. Therefore, the shift register unit provided by the above embodiment can realize the PWM function of the output signal. When the shift register unit provided in the above embodiment is used to output the second scan signal G2 and the light emitting control signal EM, the pulse width of the second scan signal G2 and the pulse width of the light emitting control signal EM can be adjusted as required, thereby ensuring the working performance of the internal pixel circuit.

Therefore, when the gate driving circuit provided by the embodiment of the present disclosure includes the above-mentioned shift register unit, the above-mentioned beneficial effects are also achieved, which will not be repeated here.

Figure 10:
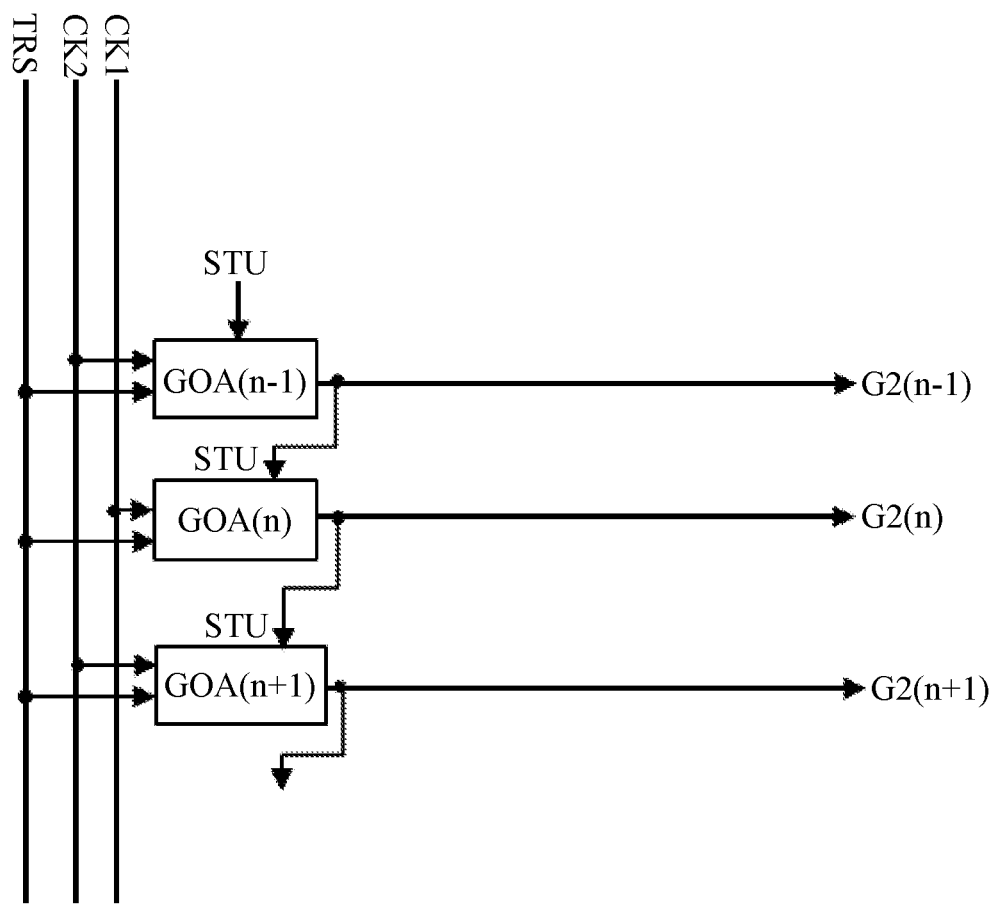
FIG. 10 is a schematic diagram of a gate driving circuit provided by an embodiment of the disclosure.

As shown in FIG. 10, in some embodiments, a plurality of the shift register units are cascaded, and among adjacent shift register units, a signal output terminal OUT of a current shift register unit is coupled to a signal input terminal of a next shift register unit, so as to provide an input signal to the next shift register unit.

Specifically, FIG. 10 is the schematic diagram showing cascade connection of the (n−1)th shift register unit GOA (n−1), the nth shift register unit GOA(n), and the (n+1)th shift register unit GOA(n+1).

The signal output terminal OUT of the (n−1)th shift register unit GOA(n−1) outputs the second scanning signal $G2(n-1)$ corresponding to the (n−1)th row of pixels in the display panel; the signal output terminal OUT of the nth shift register unit GOA(n) outputs the second scanning signal $G2(n)$ corresponding to the nth row of pixels in the display panel; the signal output terminal OUT of the (n+1)th shift register unit GOA(n+1) outputs the second scan signal $G2(n+1)$ corresponding to the (n+1)th row of pixels in the display panel.

The (n−1)th shift register unit GOA(n−1), the nth shift register unit GOA(n), and the (n+1)th shift register unit GOA(n+1) are cascaded in sequence, and the signal output terminal OUT of the (n−1)th shift register unit GOA(n−1) is coupled to the signal input terminal STU of the nth shift register unit GOA(n), and the signal output terminal OUT of the nth shift register unit GOA(n) is coupled to the signal input terminal STU of the (n+1)th shift register unit GOA (n+1).

It is worth noting that CK1 and CK2 in FIG. 10 represent two clock signals with opposite phases.

The embodiments of the present disclosure also provide a display device, which includes the gate driving circuit provided in the above-mentioned embodiments.

Since the gate driving circuit provided by the above-mentioned embodiment includes the above-mentioned shift register unit, so that the gate driving circuit can realize the PWM function of the output signal. When the gate driving circuit provided by the above-mentioned embodiment is used to output the second scan signal G2 and the light emitting control signal EM, the pulse width of the second scan signal G2 and pulse width of the light emitting control signal EM can be adjusted as required, thereby ensuring the working performance of the internal pixel circuit.

Therefore, when the display device provided by the embodiment of the present disclosure includes the above-mentioned gate driving circuit, the above-mentioned beneficial effects are also achieved, which will not be repeated here.

It should be noted that the display device may be any product or component with a display function, such as a TV, a monitor, a digital photo frame, a mobile phone, a tablet computer, and so on.

The embodiment of the present disclosure also provides a method for driving the shift register unit, which is used to drive the shift register unit provided in the above embodiment, and the driving method includes the following steps.

As shown in FIG. 5, in the first reset phase P1, the signal input terminal STU writes a low level input signal; under the control of the input control terminal CK, the input circuit 1 controls to connect the signal input terminal and the first node Q1; under the control of the first level signal input terminal V1 and the input control terminal CK, the inverter circuit 6 controls to connect the first level signal input terminal V1 and the second node Q2; under the control of the second node Q2, the output pull-down circuit 5 controls to connect the signal output terminal OUT and the second level signal input terminal V2.

In the initial phase P2, the signal input terminal writes a high level input signal; under the control of the input control terminal CK, the input circuit 1 controls to disconnect the signal input terminal and the first node Q1; under the control of the first level signal input terminal V1 and the input control terminal CK, the inverter circuit 6 controls to disconnect the first level signal input terminal V1 and the second node Q2.

In the first sub-phase P31 of the output phase P3, the signal input terminal continues to write a high level input signal; under the control of the input control terminal CK, the input circuit 1 controls to connect the signal input terminal and the first node Q1; under the control of the first node Q1 and the second level signal input terminal V2, the inverter circuit 6 controls to connect the second node Q2 and the second level signal input terminal V2; under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3; under the control of the second terminal of the first capacitor circuit 3, the output circuit 4 controls to connect the first level signal input terminal V1 and the signal output terminal OUT.

In the second sub-phase P32 of the output phase P3, the signal input terminal writes a low level input signal; under the control of the input control terminal CK, the input circuit 1 controls to disconnect the signal input terminal and the first node Q1, under the action of the first capacitor circuit 3, the potential of the first node Q1 continues to be maintained at the potential in the first sub-phase P31; under the control of the first level signal input terminal V1, the coupling circuit 2 continues to control to connect the first node Q1 and the second terminal of the first capacitor circuit 3; under the control of the second terminal of the first capacitor circuit 3, the output circuit 4 continues to control to connect the first level signal input terminal V1 and the signal output terminal OUT.

In the second reset phase P4 and the maintenance phase P5, the signal input terminal continues to write a low level input signal; under the control of the input control terminal CK, the input circuit 1 controls to connect the signal input terminal and the first node Q1; under the control of the first level signal input terminal V1 and the input control terminal CK, the inverter circuit 6 controls to connect the first level signal input terminal V1 and the second node Q2; under the control of the second node Q2, the output pull-down circuit 5 controls to connect the signal output terminal OUT and the second level signal input terminal V2.

In more detail, the working process of the shift register unit in a working period is as follows.

In the first reset phase P1, the input signal written by the signal input terminal STU is a low level; the input control terminal CK writes a high level clock signal, and under the control of the high level clock signal, the input circuit 1 controls to connect the signal input terminal and the first node Q1, transmits the low level input signal to the first node Q1; under the control of the first level signal input terminal V1 and the input control terminal CK, the inverter circuit 6 controls to connect the first level signal input terminal V1 and the second node Q2, and transmits the first level signal inputted by the first level signal input terminal V1 to the second node Q2; under the control of the second node Q2, the output pull-down circuit 5 controls to connect the signal output terminal OUT and the second level signal input terminal V2, and pulls down the potential of the signal output terminal OUT to a low level.

In the initial phase P2, the signal input terminal starts to write a high level input signal; the input control terminal CK writes a low level clock signal, and under the control of the low level clock signal, the input circuit 1 controls to disconnect the signal input terminal and the first node Q1, to keep the first node Q1 at a low level; under the control of the first level signal input terminal V1 and the input control terminal CK, the inverter circuit 6 controls to disconnect the first level signal input terminal V1 and the second node Q2, and the potential of the signal output terminal OUT is kept at a low level.

In the first sub-phase P31 of the output phase P3, the signal input terminal continues to write a high level input signal; under the control of the input control terminal CK, the input circuit 1 controls to connect the signal input terminal and the first node Q1, and pulls up the potential of the first node Q to a high level; when the input control terminal CK writes a low level clock signal, under the control of the low level clock signal, the input circuit 1 controls to disconnect the signal input terminal and the first node Q1, keeps the first node Q1 at a high level; under the control of the first node Q1 and the second level signal input terminal V2, the inverter circuit 6 controls to connect the second node Q2 and the second level signal input terminal V2, and pulls down the potential of the second node Q2 to a low level; under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3; under the control of the second terminal of the first capacitor circuit 3, the output circuit 4 controls to connect the first level signal input terminal V1 and the signal output terminal OUT, pulls up the potential of the signal output terminal OUT to a high level.

In the second sub-phase P32 of the output phase P3, the signal input terminal writes a low level input signal; the input control terminal CK writes a low level clock signal, and under the control of the low level clock signal, the input circuit 1 controls to disconnect the signal input terminal and the first node Q1; under the action of the first capacitor circuit 3, the potential of the first node Q1 continues to be maintained at a high level; at the same time, the potential of the signal output terminal OUT is a high level.

In the second reset phase P4 and the maintenance phase P5, the signal input terminal stops writing an input signal, that is, the input signal written by the signal input terminal is a low level; the input control terminal CK writes a high level clock signal, under the control of the high level clock signal, the input circuit 1 controls to connect the signal input terminal and the first node Q1, and transmits the low level input signal to the first node Q1, and pulls down the potential of the first node Q1 to a low level; under the control of the first level signal input terminal V1 and the input control terminal CK, the inverter circuit 6 controls to connect the first level signal input terminal V1 and the second node Q2; under the control of the second node Q2, the output pull-down circuit 5 controls to connect the signal output terminal OUT and the second level signal input terminal V2.

The embodiment of the present disclosure also provides a method for driving the shift register unit, which is used to drive the shift register unit provided in the above embodiment, and the driving method includes the following steps.

As shown in FIG. 8, in the first reset phase P1, the signal input terminal STU writes a high level input signal; under the control of the input control terminal CK, the input circuit 1 controls to connect the signal input terminal and the first node Q1; under the control of the first node Q1 and the second level signal input terminal V2, the inverter circuit 6 controls to connect the second node Q2 and the second level signal input terminal V2; under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3; under the control of the second terminal of the first capacitor circuit 3, the output circuit 4 controls to connect the first level signal input terminal V1 and the signal output terminal OUT.

In the initial phase P2, the signal input terminal writes a low level input signal; under the control of the input control terminal CK, the input circuit 1 controls to disconnect the signal input terminal and the first node Q1; under the control of the first node Q1 and the second level signal input terminal V2, the inverter circuit 6 controls to connect the second node Q2 and the second level signal input terminal V2; under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3; under the control of the second terminal of the first capacitor circuit 3, the output circuit 4 controls to connect the first level signal input terminal V1 and the signal output terminal OUT.

In the first sub-phase P31 of the output phase P3, the signal input terminal continues to write a low level input signal; under the control of the input control terminal CK, the input circuit 1 controls to connect the signal input terminal and the first node Q1; under the control of the first level signal input terminal V1 and the input control terminal CK, the inverter circuit 6 controls to connect the first level signal input terminal V1 and the second node Q2; under the control of the second node Q2, the output pull-down circuit 5 controls to connect the signal output terminal OUT and the second level signal input terminal V2.

In the second sub-phase P32 of the output phase P3, the signal input terminal writes a high level input signal; under the control of the input control terminal CK, the input circuit 1 controls to disconnect the signal input terminal and the first node Q1, under the action of the first capacitor circuit 3, the potential of the first node Q1 continues to be maintained at the potential in the first sub-phase P31; under the control of the first level signal input terminal V1 and the input control terminal CK, the inverter circuit 6 continues to control to connect the first level signal input terminal V1 and the second node Q2; under the control of the second node Q2, the output pull-down circuit 5 controls to connect the signal output terminal OUT and the second level signal input terminal V2.

In the second reset phase P4 and the maintenance phase P5, the signal input terminal continues to write a high level input signal; under the control of the input control terminal CK, the input circuit 1 controls to connect the signal input terminal and the first node Q1; under the control of the first node Q1 and the second level signal input terminal V2, the inverter circuit 6 controls to connect the second node Q2 and the second level signal input terminal V2, under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3; under the control of the second terminal of the first capacitor circuit 3, the output circuit 4 controls to connect the first level signal input terminal V1 and the signal output terminal OUT.

In more detail, in the first reset phase P1, the signal input terminal STU writes a high level input signal; under the control of the input control terminal CK, the input circuit 1 controls to connect the signal input terminal and the first node Q1, transmits a high level input signal to the first node Q1; under the control of the first node Q1 and the second level signal input terminal V2, the inverter circuit 6 controls to connect the second node Q2 and the second level signal input terminal V2, and transmit the second level signal written by the second level signal input terminal V2 to the second node Q2; under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3, and transmits the high level input signal to the second terminal of the first capacitor circuit 3; under the control of the second terminal of the first capacitor circuit 3, the output circuit 4 controls to connect the first level signal input terminal V1 and the signal output terminal OUT.

In the initial phase P2, the signal input terminal writes a low level input signal; under the control of the input control terminal CK, the input circuit 1 controls to disconnect the signal input terminal and the first node Q1, the first node Q1 continues to maintain at a high level; under the control of the first node Q1 and the second level signal input terminal V2, the inverter circuit 6 continues to control to connect the second node Q2 and the second level signal input terminal V2; under the control of the second node Q2, the output pull-down circuit 5 continues to control to disconnect the signal output terminal OUT and the second level signal input terminal V2; under the control of the first level signal input terminal V1, the coupling circuit 2 continues to control to connect the first node Q1 and the second terminal of the first capacitor circuit 3; under the control of the second terminal of the first capacitor circuit 3, the output circuit 4 controls to connect the first level signal input terminal V1 and the signal output terminal OUT.

In the first sub-phase P31 of the output phase P3, the signal input terminal continues to write a low level input signal; under the control of the input control terminal CK, the input circuit 1 controls to connect the signal input terminal and the first node Q1, transmits the low level input signal to the first node Q1; under the control of the first level signal input terminal V1 and the input control terminal CK, the inverter circuit 6 controls to connect the first level signal input terminal V1 and the second node Q2; under the control of the second node Q2, the output pull-down circuit 5 controls to connect the signal output terminal OUT and the second level signal input terminal V2.

In the second sub-phase P32 of the output phase P3, the signal input terminal writes a high level input signal; under the control of the input control terminal CK, the input circuit 1 controls to disconnect the signal input terminal and the first node Q1, under the action of the first capacitor circuit 3, the potential of the first node Q1 continues to be maintained at the low potential in the first sub-phase P31; under the control the first level signal input terminal V1 and the input control terminal CK, the inverter circuit 6 continues to control to connect the first level signal input terminal V1 and the second node Q2; under the control of the second node Q2, the output pull-down circuit 5 controls to connect the signal output terminal OUT and the second level signal input terminal V2.

In the second reset phase P4 and the maintenance phase P5, the signal input terminal continues to write a high level input signal; under the control of the input control terminal CK, the input circuit 1 controls to connect the signal input terminal and the first node Q1, transmits a high level input signal to the first node Q1; under the control of the first node Q1 and the second level signal input terminal V2, the inverter circuit 6 controls to connect the second node Q2 and the second level signal input terminal V2; under the control of the second node Q2, the output pull-down circuit 5 controls to disconnect the signal output terminal OUT and the second level signal input terminal V2; under the control of the first level signal input terminal V1, the coupling circuit 2 controls to connect the first node Q1 and the second terminal of the first capacitor circuit 3; under the control of the second terminal of the first capacitor circuit 3, the output circuit 4 controls to connect the first level signal input terminal V1 and the signal output terminal OUT.

It should be noted that the various embodiments in the present specification are described in a progressive manner, and that similar parts between the different embodiments can be referred to each other, and that each embodiment focuses on differences from other embodiments. In particular, since the method embodiments are substantially similar to the product embodiments, they will be described with reference to the description of the product embodiments.

Unless defined otherwise, technical or scientific terms used herein shall have the ordinary meaning as understood by one of ordinary skill in the art to which the disclosure belongs. As used in this disclosure, the terms "first, second" and the like do not denote any order, quantity, or importance, but rather are used to distinguish one part from another. The word "comprise" or "include" or the like, means that the element or object preceded by the word is inclusive of the element or object listed after the word and its equivalents, and does not exclude other elements or objects. Similar terms such as "connect" or "couple" or "join" are not limited to physical or mechanical connections, but may include electrical connections, whether direct or indirect. "Upper, lower, left, right" and the like are used merely to denote relative positional relationships, which may change accordingly when the absolute position of the object being described changes.

It can be understood that when an element such as a layer, film, area or substrate is referred to as being "upper" or "lower" located on the other element, it can be "directly upper" or "lower" located on the other element or intervening elements may be present.

In the description of the above embodiments, the particular features, structures, materials, or characteristics may be combined in any suitable manner in any one or more of the embodiments or examples.

The above description is merely specific implementations of the present disclosure, and the scope of protection of the present disclosure is not limited thereto, and any modification and substitution apparent to those skilled in the art without departing from the technical scope of the present disclosure shall be covered by the scope of protection of the present disclosure. Accordingly, the scope of protection of the present disclosure is as set forth in the claims.

What is claimed is:

1. A shift register unit, comprising:
    an input circuit, respectively coupled to an input control terminal, a signal input terminal and a first node;
    a first capacitor circuit, a first terminal of the first capacitor circuit being coupled to a signal output terminal;
    an output circuit, respectively coupled to a second terminal of the first capacitor circuit, a first level signal input terminal and the signal output terminal;
    an output pull-down circuit, respectively coupled to a second node, the signal output terminal, and a second level signal input terminal;
    a coupling circuit, respectively coupled to the first level signal input terminal, the first node, and the second terminal of the first capacitor, configured to control to connect or disconnect the first node and the second terminal of the first capacitor circuit under the control of the first level signal input terminal;
    an inverter circuit, respectively coupled to the input control terminal, the first node, the second node, the first level signal input terminal, and the second level signal input terminal, and configured to control to connect or disconnect the second node and the first level signal input terminal under the control of the input control terminal, the first level signal input terminal and the first node, and configured to control to connect or disconnect the second node and the second level signal input terminal under the control of the first node and the second level signal input terminal; and
    a second reset circuit, respectively directly connected to a reset control terminal, the first level signal input terminal and the first node, and configured to control to connect or disconnect the first level signal input terminal and the first node under the control of the reset control terminal, wherein;
    the first level signal input terminal is configured to input a high level, the second level signal input terminal is configured to input a low level,
    wherein the input circuit includes a first transistor, a gate electrode of the first transistor is coupled to the input control terminal, and a first electrode of the first transistor is coupled to the signal input terminal, and a second electrode of the first transistor is coupled to the first node, wherein the inverter circuit
comprises:
    a second transistor, a gate electrode of the second transistor being coupled to the first level signal input terminal, and a first electrode of the second transistor being coupled to the input control terminal, the first level signal input terminal and the input control terminal are different terminals;
    a third transistor, a gate electrode of the third transistor being coupled to the first node, a first electrode of the third transistor being coupled to a second electrode of the second transistor, a second electrode of the third transistor being coupled to the second level signal input terminal;
    a fourth transistor, a gate electrode of the fourth transistor being coupled to the second electrode of the second transistor, and a first electrode of the fourth transistor being coupled to the first level signal input terminal, a second electrode of the fourth transistor being coupled to the second node; and
    a fifth transistor, a gate electrode of the fifth transistor being coupled to the first node, a first electrode of the fifth transistor being coupled to the second node, and a second electrode of the fifth transistor being coupled to the second level signal input terminal,
wherein the gate electrode of the first transistor and the first electrode of the second transistor are directly connected and connected to a same clock signal.

2. The shift register unit according to claim 1, wherein the second reset circuit comprises a twelfth transistor, a gate electrode of the twelfth transistor is coupled to the reset control terminal, and a first electrode of the twelfth transistor is coupled to the first level signal input terminal, and a second electrode of the twelfth transistor is coupled to the first node.

3. The shift register unit according to claim 1, further comprising: a protection circuit, wherein
the output pull-down circuit is coupled to a third node, and the third node is coupled to the second level signal input terminal through the protection circuit;
the protection circuit is coupled to the second node, the signal output terminal, and the first level signal input terminal; the protection circuit is used to control to connect or disconnect the third node and the second level signal input terminal under the control of the second node; the protection circuit is also used to control to connect or disconnect the first level signal input terminal and the third node under the control of the signal output terminal.

4. The shift register unit according to claim 3, wherein the protection circuit includes a ninth transistor and a tenth transistor;
a gate electrode of the ninth transistor is coupled to the second node, a first electrode of the ninth transistor is coupled to the third node, and a second electrode of the ninth transistor is coupled to the second level signal input terminal; and
a gate electrode of the tenth transistor is coupled to the signal output terminal, a first electrode of the tenth transistor is coupled to the first level signal input terminal, and a second electrode of the tenth transistor is coupled to the third node.

5. The shift register unit according to claim 1, further comprising:
a second capacitor circuit, a first terminal of the second capacitor circuit being coupled to the second node, a second terminal of the second capacitor circuit being coupled to the second level signal input terminal.

6. The shift register unit according to claim 1, wherein the coupling circuit includes a sixth transistor, a gate electrode of the sixth transistor is coupled to the first level signal input terminal, and a first electrode of the sixth transistor is coupled to the first node, and a second electrode of the sixth transistor is coupled to the second terminal of the first capacitor circuit.

7. The shift register unit according to claim 1, wherein the output circuit includes a seventh transistor, a gate electrode of the seventh transistor is coupled to the second terminal of the first capacitor circuit, and a first terminal of the seventh transistor is connected to the first level signal input terminal, and a second electrode of the seventh transistor is coupled to the signal output terminal.

8. The shift register unit according to claim 1, wherein the output pull-down circuit includes an eighth transistor, a gate electrode of the eighth transistor is coupled to the second node, and a first electrode of the eighth transistor is coupled to the signal output terminal, a second electrode of the eighth transistor is coupled to the second level signal output terminal.

9. A gate driving circuit comprising a plurality of shift register units according to claim 1.

10. The gate driving circuit according to claim 9, wherein the plurality of the shift register units are cascaded, and among adjacent shift register units, a signal output terminal of a current shift register unit is coupled to a signal input terminal of a next shift register unit, so as to provide an input signal to the next shift register unit.

11. The gate driving circuit according to claim 10, wherein clock signals of two adjacent shift register units are inverted in phase.

12. A display device comprising the gate driving circuit according to claim 9.

13. A display device comprising the gate driving circuit according to claim 10.

14. A method for driving the shift register unit according to claim 1, the driving method comprises:
in a first reset phase, the signal input terminal writing a high level input signal; under the control of the input control terminal, the input circuit controlling to connect the signal input terminal and the first node; under the control of the first node and the second level signal input terminal, the inverter circuit controlling to connect the second node and the second level signal input terminal; under the control of the second node, the output pull-down circuit controlling to disconnect the signal output terminal and the second level signal input terminal; under the control of the first level signal input terminal, the coupling circuit controlling to connect the first node and the second terminal of the first capacitor circuit; under the control of the second terminal of the first capacitor circuit, the output circuit controlling to connect the first level signal input terminal and the signal output terminal;
in an initial phase, the signal input terminal writing a low level input signal; under the control of the input control terminal, the input circuit controlling to disconnect the signal input terminal and the first node; under the control of the first node and the second level signal input terminal, the inverter circuit controlling to connect the second node and the second level signal input terminal; under the control of the second node, the output pull-down circuit controlling to disconnect the signal output terminal and the second level signal input terminal; under the control of the first level signal input terminal, the coupling circuit controlling to connect the first node and the second terminal of the first capacitor circuit; under the control of the second terminal of the first capacitor circuit, the output circuit controlling to connect the first level signal input terminal and the signal output terminal;
in a first sub-phase of an output phase, the signal input terminal continuing to write the low level input signal; under the control of the input control terminal, the input circuit controlling to connect the signal input terminal and the first node; under the control of the first level signal input terminal, the input control terminal and the first node, the inverter circuit controlling to connect the first level signal input terminal and the second node; under the control of the second node, the output pull-down circuit controlling to connect the signal output terminal and the second level signal input terminal;
in a second sub-phase of the output phase, the signal input terminal writing a high level input signal; under the control of the input control terminal, the input circuit controlling to disconnect the signal input terminal and the first node, under the action of the first capacitor circuit, the potential of the first node continuing to be maintained at a potential in the first sub-phase; under the control of the first level signal input terminal, the input control terminal and the first node, the inverter circuit continuing to control to connect the first level signal input terminal and the second node; under the control of the second node, the output pull-down circuit controlling to connect the signal output terminal and the second level signal input terminal; and in a second reset phase and a maintenance phase, the signal input terminal continuing to write a high level input signal; under the control of the input control terminal, the input circuit controlling to connect the signal input terminal and the first node; under the control of the first node and the second level signal input terminal, the inverter circuit controlling to connect the second node and the second level signal input terminal, under the control of the second node, the output pull-down circuit controlling to disconnect the signal output terminal and the second level signal input terminal; under the control of the first level signal input terminal, the coupling circuit controlling to connect the first node and the second terminal of the first capacitor circuit; under the control of the second terminal of the first capacitor circuit, the output circuit controlling to connect the first level signal input terminal and the signal output terminal.

* * * * *